US010050101B2

(12) United States Patent
Gajda et al.

(10) Patent No.: US 10,050,101 B2
(45) Date of Patent: Aug. 14, 2018

(54) APPARATUS AND ASSOCIATED METHOD

(71) Applicant: Nexperia B.V., Nijmegen OT (NL)

(72) Inventors: Mark Andrzej Gajda, Hazel Grove (GB); Barry Wynne, Glossop (GB)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/403,663

(22) Filed: Jan. 11, 2017

(65) Prior Publication Data
US 2017/0207297 A1    Jul. 20, 2017

(30) Foreign Application Priority Data
Jan. 18, 2016    (EP) .................................... 16151749

(51) Int. Cl.
*H01L 21/00*    (2006.01)
*H01L 27/00*    (2006.01)
*H01L 29/00*    (2006.01)
*H01L 49/02*    (2006.01)
*H01L 23/00*    (2006.01)
*H01L 29/778*    (2006.01)
*H01L 27/06*    (2006.01)
(Continued)

(52) U.S. Cl.
CPC .......... *H01L 28/24* (2013.01); *H01L 21/2654* (2013.01); *H01L 21/761* (2013.01); *H01L 21/7605* (2013.01); *H01L 24/05* (2013.01); *H01L 27/0605* (2013.01); *H01L 27/0629* (2013.01); *H01L 29/778* (2013.01); *H01L 29/20* (2013.01); *H01L 29/2003* (2013.01); *H01L 2224/0556* (2013.01)

(58) Field of Classification Search
CPC ............... H01L 21/761; H01L 21/2654; H01L 21/7605; H01L 27/0629; H01L 27/0605; H01L 27/101; H01L 24/05; H01L 24/48; H01L 24/45; H01L 29/778; H01L 29/20; H01L 29/2003; H01L 2224/0556
See application file for complete search history.

(56) References Cited

U.S. PATENT DOCUMENTS 8,174,048 B2 *    5/2012    Beach ............... H01L 29/42316
257/190
9,076,707 B2 *    7/2015    Harmon ............ H01L 27/14643
(Continued)

FOREIGN PATENT DOCUMENTS

CN        104049666 A        9/2014
EP        1 158 584 A2        11/2001
(Continued)

OTHER PUBLICATIONS

Extended European Search Report for Patent Appln. No. 16151749.5 (dated Jun. 28, 2016).
(Continued)

*Primary Examiner* — Nikolay Yushin
(74) *Attorney, Agent, or Firm* — Ohlandt, Greeley, Ruggiero & Perle, L.L.P.

(57) ABSTRACT

A semiconductor arrangement comprising; a die of III-V semiconductor material; a resistor element integrated in the die, the resistor element comprising a track defined by a first implant material in the III-V semiconductor material of the die, said track electrically isolated from substantially the remainder of the die by an isolation region that surrounds the track.

13 Claims, 3 Drawing Sheets

(51) Int. Cl.
  *H01L 21/76* (2006.01)
  *H01L 21/761* (2006.01)
  *H01L 21/265* (2006.01)
  *H01L 29/20* (2006.01)

(56) References Cited

U.S. PATENT DOCUMENTS

| | | | |
|---|---|---|---|
| 2005/0194612 A1* | 9/2005 | Beach | H01L 29/42316 257/192 |
| 2006/0076585 A1 | 4/2006 | Kato et al. | |
| 2007/0194390 A1 | 8/2007 | Chinthakindi et al. | |
| 2012/0228625 A1 | 9/2012 | Ikeda | |
| 2013/0032817 A1 | 2/2013 | Miwa et al. | |
| 2014/0091311 A1 | 4/2014 | Jeon et al. | |
| 2014/0312448 A1* | 10/2014 | Harmon | H01L 27/14643 257/438 |
| 2014/0346570 A1 | 11/2014 | Ueno | |
| 2015/0084685 A1 | 3/2015 | Hirose et al. | |
| 2016/0329369 A1* | 11/2016 | Harmon | H01L 31/00 |
| 2017/0025405 A1* | 1/2017 | Jeon | H01L 27/0629 |

FOREIGN PATENT DOCUMENTS

| | | |
|---|---|---|
| EP | 2 736 171 A1 | 5/2014 |
| JP | 4-38861 A | 2/1992 |
| JP | 11-214616 A | 8/1999 |
| JP | 2000-200872 A | 7/2000 |
| JP | 2001-118989 A | 4/2001 |
| JP | 2002-76270 A | 3/2002 |

OTHER PUBLICATIONS

Extended European Search Report for Patent Appln. No. 161517496.1 (dated Jul. 5, 2016).

* cited by examiner

APPARATUS AND ASSOCIATED METHOD

CROSS-REFERENCE TO RELATED APPLICATIONS

This application claims the priority under 35 U.S.C. § 119 of European Patent application no. 16151749.5, filed on Jan. 18, 2016, the contents of which are incorporated by reference herein.

The present disclosure relates to the field of semiconductor arrangements. In particular, it relates to an integrated resistor element in a III-V semiconductor die. We also disclose a method of forming an integrated resistor element.

According to a first aspect of the present disclosure there is provided a semiconductor arrangement comprising;
 a die of III-V semiconductor material;
 a resistor element integrated in the die, the resistor element comprising a track defined by a first implant material in the III-V semiconductor material of the die, said track electrically isolated from substantially the remainder of the die by an isolation region that surrounds the track.

This is advantageous as the first implant material is provided to modify a two dimensional electron gas region of the III-V semiconductor material and thereby increase the sheet resistance of the III-V semiconductor material to conveniently define an integrated resistor element.

In one or more embodiments, the isolation region is defined by a second implant material in the III-V semiconductor material of the die. In one or more embodiments, the isolation region is defined by trench isolation.

In one or more embodiments, the resistor element includes a first terminal and a second terminal with the track extending therebetween to provide a resistive pathway between the first and second terminals, the first and/or second terminal extending to a surface of the die.

In one or more embodiments, the first implant material is selected from Argon or Nitrogen based material. In one or more embodiments, the second implant material is selected from Argon or Nitrogen material. In one or more embodiments, the first implant material is the same as the second implant material. In one or more embodiments, the first implant material is different to the second implant material.

In one or more embodiments, the track is defined by a portion of the die having a first concentration of the first implant material and the isolation region is defined by a portion of the die surrounding the track and having a second concentration of the second implant material, higher than the first concentration. Thus, the first concentration may be provided to control the sheet resistance of the two-dimensional electron gas (2DEG) region while the second concentration may be at least one, two, three or more orders of magnitude higher in sheet resistance to electrically isolate the track. The first and second implant material may overlap, although in other embodiments they do not overlap. It will be appreciated that when dry-etch trench isolation techniques are used, the second implant material is not required.

In one or more embodiments, the semiconductor arrangement includes a further integrated component on the die, the further electronic component comprising at least one bond pad formed on a surface of the die to provide for connection to the electronic component, the resistor element arranged, at least in part, directly beneath the at least one bond pad. In one or more embodiments, the resistor element is wholly outside the area of the further integrated component.

In one or more embodiments, a majority of the area of the resistor element is arranged directly beneath the at least one bond pad.

In one or more embodiments, the resistor element includes a first terminal and a second terminal with the track extending therebetween to provide a resistive pathway between the first and second terminals, and wherein an electrical connection is provided between one of the first and second terminals of the resistor element and said bond pad.

In one or more embodiments, the electronic component is a HEMT and the at least one bond pad comprises one of a source bond pad, a drain bond pad and a gate bond pad of the HEMT. In one or more embodiments, the HEMT comprises a Schottky or an insulated gate operating in depletion or enhancement mode.

In one or more embodiments, the electronic component is a HEMT having a source bond pad, a drain bond pad and a gate bond pad, the first terminal of the resistor element connected to the gate bond pad and the second terminal of the resistor element connected to the source bond pad.

In one or more embodiments, the die is of Gallium Nitride, Gallium Arsenide, Indium Phosphide, Aluminium Nitride, Indium Gallium Nitride or Gallium Oxide ($Ga_2O_3$).

In one or more embodiments, the resistor element integrated in the die comprises part of an active integrated component or a passive integrated component. In one or more embodiments, the passive integrated component comprises an inductor, a transformer or an antenna (such as for mobile phone). In one or more embodiments, the active integrated component comprises a HEMT and the resistor element comprises a drift region between a drain and source thereof or a diode and the resistor element comprises a drift region of the diode between an anode and a cathode of the diode.

According to a second aspect of the present disclosure there is provided a semiconductor package including the semiconductor arrangement of the first aspect.

According to a third aspect of the present disclosure there is provided an electronic device including the semiconductor arrangement of the first aspect or the semiconductor package of the second aspect. In one or more embodiments, the electronic device comprises an amplifier, a cell tower for a mobile phone network, a power correction circuit, a half- or full-bridge circuit, a power supply, an inverter and other circuit topologies.

According to a fourth aspect of the present disclosure there is provided a method of forming an integrated resistor element comprising;
 implanting ions of a first implant material by ion implantation into a die of III-V semiconductor material to define a track for forming the resistor element;
 electrically isolating said track from the remainder of the die thereby forming an isolation region that at least surrounds the track.

In one or more embodiments, the step of electrically isolating comprises electrically isolating by implanting a second implant material into the III-V semiconductor material of the die or by trench isolation. In one or more embodiments, the first implant material and the second implant material are the same material and the method includes implanting a lower dose of the ions of the implant material to form the track than the isolation region.

In one or more embodiments, the method comprises implanting the first implant material at a dose of $1 \times 10^{12}$ to $1 \times 10^{13}$ at substantially 180 keV to form the track. It will be appreciated that other energies may be used such as an energy sufficient to reach the two-dimensional electron gas (2DEG), which may depend on the implant species.

In one or more embodiments, the method comprises implanting the second implant material at a dose of $1\times10^{13}$ to $1\times10^{15}$ at substantially 180 keV to form the isolation region.

It will be appreciated that other energies may be used such as an energy sufficient to reach the two-dimensional electron gas (2DEG), which may depend on the implant species.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Many III-V semiconductor based components that require a resistor may use discrete components or resistors formed on silicon. Hereinafter we disclose the integration of a resistor in a III-V semiconductor die and, in particular, a Gallium Nitride (GaN) die.

The present disclosure may allow for various applications and circuit topologies that use GaN-based (or more generally III-V based) devices that require the manufacture of resistive components using a sheet resistance greater than the intrinsic two-dimensional electron gas (2DEG) sheet resistance provided by die. The method disclosed provides a means to efficiently and advantageously realise this requirement.

Accordingly, semiconductor arrangements that include integrated resistor elements may be formed effectively and thus may obviate the need to use discrete solutions to achieve the same technical goal, while at the same time potentially simplifying the manufacturing process, increasing product reliability and reducing cost.

Figure 1A:
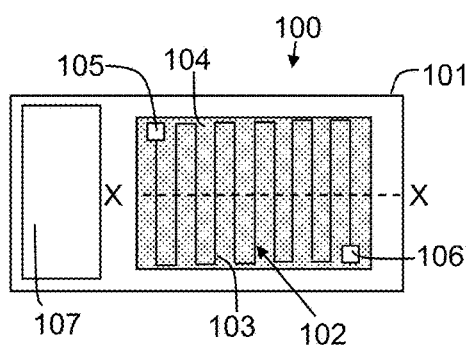
FIG. 1A shows a III-V die having an integrated resistor element formed therein along with a further device.
Figure 1B:
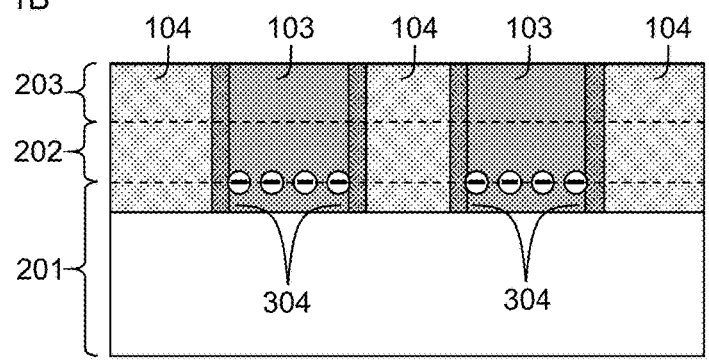
FIG. 1B shows a cross-section through the III-V die of FIG. 1 along line x-x.

FIG. 1A shows an example semiconductor arrangement 100 comprising a die 101 of III-V semiconductor material comprising a two-dimensional electron gas (2DEG) region 200. FIG. 1B shows a cross-section through the die 101 along part of the line x-x. A resistor element 102 is provided integrated in the die 101, the resistor element 102 comprising a track 103 in the III-V semiconductor material of the die defined by an implant 300 of a first implant material provided to locally increase the sheet resistance of the two-dimensional electron gas region 200. The track 103 is electrically isolated from the remainder of the die 101 by a surrounding isolation region 104 defined by a second implant material in the III-V semiconductor material of the die 101. The implanted isolation region may be directly adjacent to the track to ensure a current path through the resistor element is substantially through the track. In other embodiments, trench isolation may be used to form the isolation region rather than implantation of the second implant material. Trench isolation may comprise filling etched trenches with a dielectric to electrically isolate the resistor element. The isolation region 104 may be directly adjacent to the track 103 or it may overlap with track 103 to ensure correct definition of the track as well as electrical isolation of the component from other active elements present on the die, as part of the semiconductor arrangement 100.

Thus, the track 103 is defined by a portion of the die having a first concentration of the first implant material higher than the un-implanted or a surrounding portion of the die beyond the isolation region. The isolation region may be defined by a portion of the die surrounding the track and having a second concentration of second implant material, higher than the first concentration. FIG. 1B shows a cross-section schematic of a typical arrangement and shows overlap between the track and the isolation region.

The first implant material may comprise Argon, Nitrogen, Boron, Silicon or Phosphorous. Thus the first implant material may be provided by ion implantation of Argon (Ar+), Nitrogen (N+), Boron (B+), Silicon (Si+) or Phosphorous (P+) ions respectively into the III-V semiconductor material of the die. The second implant material may comprise Argon, Nitrogen, Boron, Silicon or Phosphorous. Thus the first implant material may be provided by ion implantation of Argon (Ar+), Nitrogen (N+), Boron (B+), Silicon (Si+) or Phosphorous (P+) ions respectively into the III-V material of the die. Accordingly, in one or more embodiments, the first implant material and/or second implant material are implanted in the die by ion implantation of ions thereof. In one or more embodiments, it may be advantageous for the first implant material and the second implant material to be the same material. This may allow for formation of the track and the isolation region by using different ion implantation doses of the implant material.

The III-V semiconductor may be selected from Gallium Nitride, Gallium Arsenide, Indium Phosphide, Aluminium Nitride, Indium Gallium Nitride or Gallium Oxide ($Ga_2O_3$). Accordingly, once implanted, the first or second implant material of the track and/or isolation region may provide impure regions detectable by trace-element techniques such as secondary ion mass spectrometry (SIMS).

As shown in FIG. 1A, the track 103 includes a first terminal 105 and a second terminal 106 at opposed ends of the track 103. The first and second terminals 105, 106 may be formed by vias that extend between a surface of the die and the 2DEG region 200 of the die 100. The terminals 105, 106 may provide for electrical connection to the resistor element 103. The terminals 105 and 106 may not include the first implant material to provide a high-quality ohmic contact that can be used to interface with other circuit components present on the semiconductor arrangement 101. However, it will be appreciated that, such as to achieve a particular contact resistance or other technical objective, the first implant material may overlap or even fully extend into area of the terminals 105 and/or 106.

The track 103, in the example of FIG. 1A, is serpentine or folded, although in other examples, the track may be any other appropriate shape. The length of the track may comprise a factor in controlling the resistance of the resistor element 102. The track may, in one or more embodiments, comprise a line or may have a different length/width aspect.

The example die 101 includes a further electronic component 107 which may or may not be electrically connected to the resistor element 102.

Figure 2:
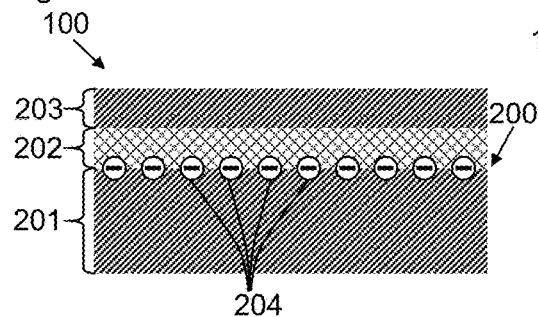
FIGS. 2 and 3 shows a schematic diagram of a cross-section through the die to show the possible effect of ion implantation of the first implant material.

FIG. 2 shows a cross-section through a typical III-V semiconductor die which, in this example comprises a Gallium Nitride (GaN) die. The die comprises a first, lower, layer 201 of GaN material. The first layer may be approximately 2 μm thick. The die further comprises a second layer 202 of Aluminium Gallium Nitride (AlGaN) directly adjacent the first layer 201. The second layer may be approximately 20 nm thick. The die further comprises a third, upper, layer 203 of GaN material, or of in-situ grown silicon nitride material, directly adjacent the second layer 202. The third layer may be approximately 3 nm thick, if it is made of GaN material, or approximately 70 nm if it is grown as a silicon nitride layer. It will be appreciated that the thicknesses of the first, second and third layers may vary depending on the manufacturer of the semiconductor wafer from which the die is formed or for design reasons. The 2DEG region 200 is formed at the interface of layers 201 and 202, as represented by schematically shown charge carriers 204.

Figure 3:
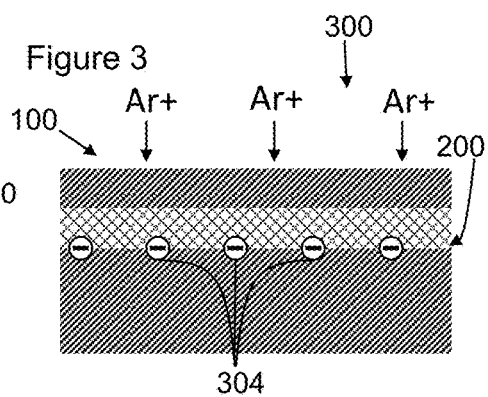

FIG. 3 shows a similar cross-section to FIG. 2, showing diagrammatically the method of implantation of the first implant material. The track 103 may be advantageously formed by localised ion implantation of the first implant material to control the sheet resistance of the 2DEG. Not wishing to be bound by theory, it is believed that the implant material partially destroys the 2DEG and/or modifies the concentration of charge carriers (electrons) in the 2DEG. Accordingly, a localised increase (i.e. defining the track) in the sheet resistance of the 2DEG may be achieved to define the resistor element 102. FIG. 3 shows the ion implantation 300 of Argon ions as the first implant material and a corresponding reduction in the number of charge carriers, shown schematically as 304. The resistor element 102 is electrically isolated from other devices on the die by the second implant material of the isolation region, which provides a (much) higher sheet resistance than the resistor element. The 2DEG may be substantially totally destroyed in the isolation region.

Typically, in a GaN die, the 2DEG sheet resistance $R_{sheet}$ is around 200-900 ohm/sq or substantially 650 ohm/sq. Such a sheet resistance may be, in some circumstances, at least 10× too low for any practical integrated resistor. For example, with such a sheet resistance a 10 MΩ resistor comprising a track 5 μm wide, would need to be ~78 mm long, which may be impractical. By providing the first implant material in the die, the sheet resistance may be increased to 6500 Ohm/sq or higher and the resistor element length may be reduced significantly, such as to 7.8 mm or less in substantially linear proportion to the increase in $R_{Sheet}$. Thus, the sheet resistance for providing the resistor element may be at least 1000 Ohm/sq. The sheet resistance for providing the resistor element may be up to 100 kOhm/sq.

Figure 4:
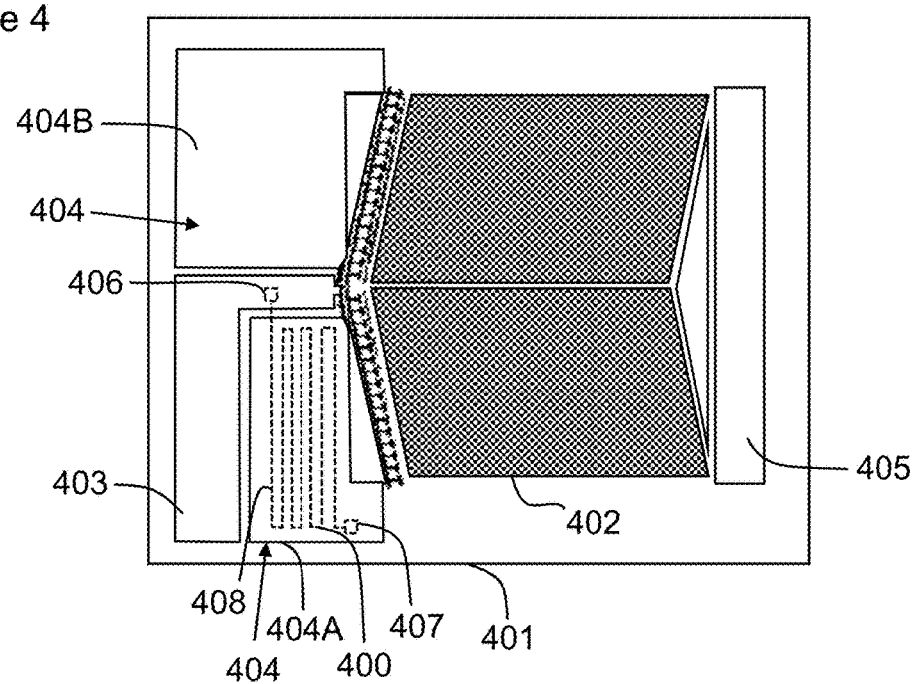
FIG. 4 shows a plan view of a transistor with the integrated resistor element.

FIG. 4 shows a further example of the integrated resistor element 400 in a III-V semiconductor die 401 along with a further integrated device 402, comprising a High Electron Mobility Transistor (HEMT). The HEMT 402 comprises a plurality of bond pads 403, 404, 405. The HEMT has three terminals, a drain, a source and a gate. The bond pad 403 comprises a gate bond pad, which provides a connection to the gate of the HEMT. The bond pad 404 comprises a source bond pad, which provides a connection to the source of the HEMT. The source bond pad 404 may be of two parts, separated by the gate bond pad 403. Other possible arrangement may include a single source bond pad with the gate situated to one side of the source bond pad. The two parts of the source bond pad are labelled 404A and 404B. The bond pad 405 comprises a drain bond pad, which provides a connection to the drain of the HEMT.

In one or more examples, the arrangement implements the integrated resistor element 400 such that it is located directly beneath the source bond pad part 404A to minimise the impact of including the resistor on the footprint of the overall die 401. The integrated resistor element 400 is located within the die 401 and, in particular, substantially within the 2DEG region 200. The bond pad 404A is substantially located on a surface of the die. The bond pads may comprise a metal layer. Accordingly, the resistor element 400 can be located beneath any one or more of the bond pads. This may be advantageous due to savings in die area. The resistor element 400 may include terminals 406, 407 to provide for connection to other devices. The terminals may provide for connection to the track 408 at a point outside the footprint of the bond pad that the resistor element lies beneath. Thus, while some or a majority of the resistor element 400 or track thereof lies directly beneath a bond pad, at least one or both of the ends of the track may extend outside the footprint of the bond pad and include a connection point on a surface of the die, such as the same surface as on which the bond pad 404A lies. In this example, the terminals 406, 407 provide for connection to the source bond pad part 404A and the gate bond pad 403. Thus, the resistor element 400 provides a resistance between the gate and source terminals of the HEMT 402.

In FIG. 4, the resistor element comprises a first integrated electrical component electrically connected to a second integrated electrical component. In other examples the resistor component may form a component part of a larger integrated electrical component. In one or more embodiments, the resistor element comprises part of an active integrated component or a passive integrated component. In one or more embodiments, the passive integrated component comprises an inductor, a transformer or an antenna (such as for mobile phone). The resistor element may be useful where resistor/impedance control or matching is required because the resistance can be accurately controlled during implantation. In one or more embodiments, the active integrated component comprises a HEMT and the resistor element comprises a drift region between a drain and source thereof or a diode and the resistor element comprises a drift region of the diode between an anode and a cathode of the diode. The resistance of the drift region may need to be accurately controlled or modified, for example in current-sensing applications.

Figure 5:
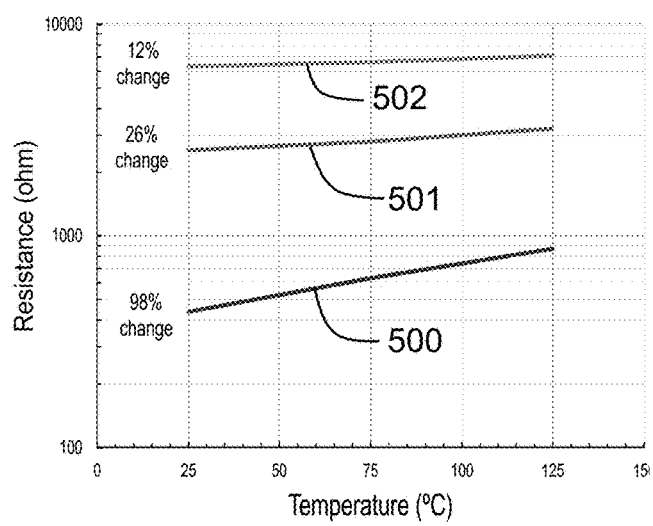
FIG. 5 shows a graph of resistance vs temperature for different ion implantation doses.

FIG. 5 shows a graph of resistance vs temperature and a comparison between resistor elements formed with different implantation doses of implant material. Line 500 shows the resistance vs temperature for a resistor formed without first implant material and therefore using only the inherent resistance of the 2DEG. Line 501 shows the resistance vs temperature for a resistor element with a first implant material implanted with a dose of $5 \times 10^{12}$ atoms/cm$^2$. Line 502 shows the resistance vs temperature for a resistor element with a first implant material implanted with a dose of $7.5 \times 10^{12}$ atoms/cm$^2$. The first implant material, in this example, comprises argon ions. The implantation of the first implant material was performed at the same energy of 180 keV. It can be seen that using the first implant material to form a track in the III-V semiconductor die may effectively form a high sheet resistance for forming space-efficient resistor elements. Further, the temperature stability of the sheet resistance may become more stable with increased doses of first implant material.

The resistor element can be used for various on-die applications including stand-alone resistors, current sources, comparators, amplifiers or to provide dominant leakage paths in cascode circuits. Having an integrated resistor may dispense with the need to have discrete components, which may improve product reliability and stability, reduce product cost and simplify the assembly process.

Figure 6:
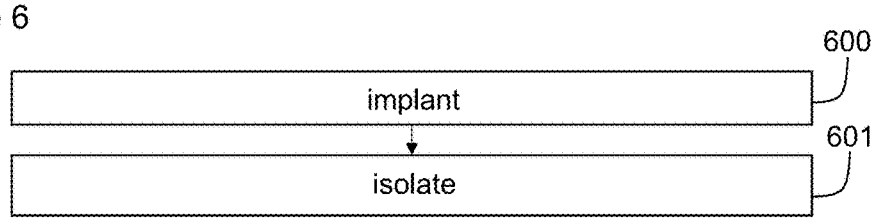
FIG. 6 shows a flowchart illustrating a method.

FIG. 6 shows a flow chart illustrating a method of forming an integrated resistor element. The method comprises a step 600 of implanting ions of a first implant material by ion implantation into a die of III-V semiconductor material to increase the sheet resistance of a two-dimensional electron gas (2DEG) region of the die to define a track for forming the resistor element; and a step 601 comprising isolating said track from the remainder of the die such as by implanting a second implant material into the III-V semiconductor material of the die to form an isolation region. Steps 600 and 601 may be performed as direct implants into the III-V semiconductor or through dielectric layers already present on the III-V semiconductor.

Thus, the 2DEG may comprise localised areas of different sheet resistance comprising a first sheet resistance outside the area of the resistor element, a second sheet resistance for the track, higher than the first sheet resistance, and a third sheet resistance for the isolation region, higher than both the first and second sheet resistance. These three areas may or may not overlap.

The method may include the step of forming a bond pad over an area of the die that includes the integrated resistor element such that said resistor element lies at least partially beneath said bond pad. In some examples but not all, for device reliability, said bond pads 404A and 404B may be electrically isolated from the resistor element 400, in whole or in part (such as by using a dielectric such as silicon nitride). Terminals 406 and 407 may be in intimate contact with bond pads when said bond pads cover terminal 406 and/or 407 in whole or in part.

The first implant material may be argon-based and thus the step of implanting ions comprises implanting argon ions (Ar+) by ion implantation. The Ar+ implant may use a lower dose than the second implant material used for device-to-device isolation and may be additional to the second implant material. Typically, the dose for ion implantation of the first implant material would be in the region of $5 \times 10^{12}$ ions/cm$^2$ to $10 \times 10^{12}$ ions/cm$^2$. For Ar+ ions the energy of the ion implantation is substantially 180 keV when the 2DEG region is approximately 20 nm below the surface of the semiconductor. The appropriate implant energy may be determined by the resulting kinetic energy of the species set by $\frac{1}{2}mv^2$ and the depth of the 2DEG region 200 below the surface of the III-V semiconductor. Accordingly, light implant species need lower energies in the region of 50-200 keV, while heavier implant species will need correspondingly higher implant energies extending typically up to 400 keV.

The second implant material is used to form the isolation region to electrically isolate the track from other components. The second implant material may comprise Argon, Nitrogen, Boron, Phosphorus, Silicon or Arsenic. The dose of the second implant material may be in the region of $1 \times 10^{13}$ ions/cm$^2$ to $1 \times 10^{15}$ ions/cm$^2$. The ion implantation of the second implant material is provided to destroy the 2DEG thus achieving electrical isolation between components. The ion implantation of the first implant materials thus uses a lower dose than the second implant material used for device-to-device isolation. The sheet resistance of the isolation region is typically in excess of 100 kOhm/sq.

Computer readable instructions for performing the method may be provided as a computer program on a computer readable medium. The computer program may be configured to provide instructions for a semiconductor fabrication device. Accordingly, the semiconductor fabrication device may include a processor and memory for execution of the computer readable instructions for performing the method.

Figure 7:
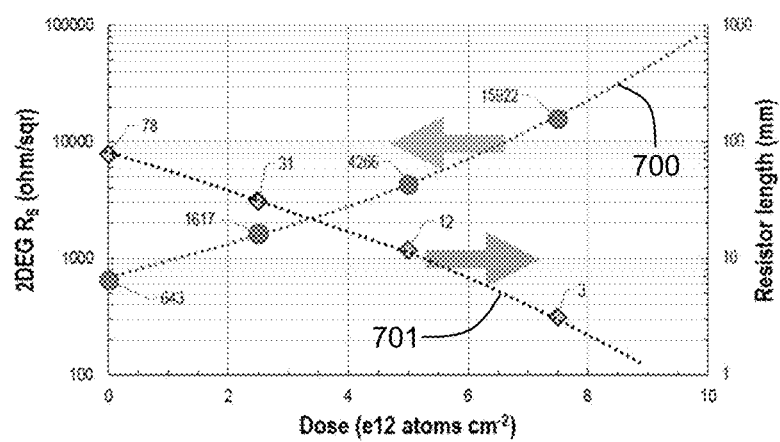
FIG. 7 shows a graph of sheet resistance or resistor length vs ion implantation dose.

FIG. 7 shows a graph comprising a first line 700 of sheet resistance vs ion implantation dose and a second line 701 of resistor length vs ion implantation dose. With reference to the first line 700 it can be seen that order of magnitude changes to the sheet resistance may be achieved by controlling the dose of ion implantation of the first implant material. With reference to the second line 701, which shows the resistor track length for a 5 µm wide track having a resistance of 10 MOhms for different ion implantation doses.

The die 101 of FIG. 1A may be incorporated into a semiconductor package. The package may include only one, two or more semiconductor dies. The package typically includes leads for connection to other components. The package may form part of an electronic device. The electronic device may comprise an amplifier, a mobile cell tower or a communication device, among others.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Integrated resistor elements on III-V semiconductor dies may be advantageous for applications in monitoring and control of Power GaN devices configured in cascode. Integrated resistors may be also used for charge balancing and leakage current steering, for example in integrated current-sources used for various applications where thermal compensation is required.

The invention claimed is:

1. A semiconductor arrangement comprising;
a die of III-V semiconductor material;
an integrated resistor element comprising a two-dimensional electron gas (2DEG) region integrated in the die, the integrated resistor element comprising a track defined by a first implant material in the III-V semiconductor material of the die, the track being electrically isolated from substantially a remainder of the die by an isolation region that surrounds the track;
wherein the isolation region is defined by a second implant material in the III-V semiconductor material of the die and the track is defined by a portion of the die having a first concentration of the first implant material and the isolation region is defined by a portion of the die surrounding the track and having a second concentration of the second implant material that is higher than the first concentration.

2. A semiconductor arrangement according to claim 1, wherein the isolation region is defined by a second implant material in the III-V semiconductor material of the die or by way of trench isolation.

3. A semiconductor arrangement according to claim 1, wherein the first implant material is selected from Argon, Nitrogen, Boron, Phosphorus, Silicon and Arsenic.

4. A semiconductor arrangement according to claim 1, wherein the die is of Gallium Nitride, Gallium Arsenide, Indium Phosphide, Aluminium Nitride, Indium Gallium Nitride or Gallium Oxide ($Ga_2O_3$).

5. A semiconductor package including the semiconductor arrangement of claim 1.

6. An electronic device including the semiconductor arrangement of claim 1.

7. A semiconductor arrangement according to claim 1, wherein the semiconductor arrangement includes a further integrated component on the die, the further integrated component comprising at least one bond pad formed on a surface of the die to provide for connection to the further integrated electronic component, the integrated resistor element arranged, at least in part, directly beneath the at least one bond pad.

8. A semiconductor arrangement according to claim 7, wherein the further integrated component is a HEMT and the at least one bond pad comprises one of a source bond pad, a drain bond pad and a gate bond pad of the HEMT.

9. A semiconductor arrangement according to claim 7, wherein the integrated resistor element includes a first terminal and a second terminal with the track extending therebetween to provide a resistive pathway between the first and second terminals, and wherein between one of the first and second terminals of the integrated resistor element and the at least one bond pad there is provided an electrical connection.

10. A semiconductor arrangement according to claim 9, wherein the further integrated component is a HEMT having a source bond pad, a drain bond pad and a gate bond pad, the first terminal of the integrated resistor element is connected to the gate bond pad and the second terminal of the resistor element is connected to the source bond pad.

11. A method of forming an integrated resistor element comprising;
implanting ions of a first implant material by ion implantation into a die of III-V semiconductor material to define a track for forming the integrated resistor element from a two-dimensional electron gas (2DEG) integrated in the die;
electrically isolating the track from a remainder of the die by implanting a second implant material into the III-V semiconductor material of the die, the first implant material being the same material as the second implant material, thereby forming an isolation region that surrounds the track,
wherein implanting the second implant material comprises implanting a higher dose of the ions of the second implant material than the dose of ions of the first implant material.

12. A method according to claim 11, wherein the method comprises implanting the first implant material at a dose of $1\times10^{12}$ ions/cm$^2$ to $1\times10^{13}$ ions/cm$^2$ to form the track.

13. A method according to claim 11, wherein the method comprises implanting the second implant material at a dose of $1\times10^{13}$ ions/cm$^2$ to $1\times10^{15}$ ions/cm$^2$ to form the isolation region.

* * * * *

UNITED STATES PATENT AND TRADEMARK OFFICE
CERTIFICATE OF CORRECTION

PATENT NO. : 10,050,101 B2
APPLICATION NO. : 15/403663
DATED : August 14, 2018
INVENTOR(S) : Mark Andrzej Gajda et al.

Page 1 of 1

It is certified that error appears in the above-identified patent and that said Letters Patent is hereby corrected as shown below:

On the Title Page

Under "Applicant"
ITEM (71)
Please correct: "Nexperia B.V., Nijmegen OT (NL)" to
--""Nexperia B.V., Nijmegen (NL)"--.

Signed and Sealed this
Twenty-fifth Day of September, 2018

Andrei Iancu
*Director of the United States Patent and Trademark Office*